United States Patent [19]
Wang et al.

[11] Patent Number: 5,920,506
[45] Date of Patent: Jul. 6, 1999

[54] METHOD AND APPARATUS FOR BULK PREPROGRAMMING FLASH MEMORY CELLS WITH MINIMAL SOURCE AND DRAIN CURRENTS

[75] Inventors: Hsingya Arthur Wang, Saratoga; Haike Dong, Mountain View; Jein-Chen Young, Milpitas; Yuan Tang, San Jose; Aaron Yip, Milpitas; Kenneth Miu, Fremont, all of Calif.

[73] Assignee: Hyundai Electronics America, Inc., San Jose, Calif.

[21] Appl. No.: 08/938,389

[22] Filed: Sep. 26, 1997

[51] Int. Cl.⁶ .................................................. G11C 16/04
[52] U.S. Cl. .............................. 365/185.18; 365/185.28; 365/185.29; 365/185.33
[58] Field of Search .................... 365/185.18, 185.28, 365/185.33, 185.27, 185.26, 185.29

[56] References Cited

U.S. PATENT DOCUMENTS

| | | | |
|---|---|---|---|
| 5,491,657 | 2/1996 | Haddad et al. | 365/185.27 |
| 5,583,811 | 12/1996 | Van Houdt et al. | 365/185.15 |
| 5,708,588 | 1/1998 | Haddad et al. | 364/491 |
| 5,726,933 | 3/1998 | Lee et al. | 365/185.18 |

OTHER PUBLICATIONS

Seiichi Artome, et al., "Reliability Issues of Flash Memory Cells," *Proceedings of the IEEE*, vol. 81, No. 5, (May 1993), pp. 776–787.

Paolo Pavan, et al.; "Flash Memory Cells—An Overview," *Proceedings of the IEEE*, vol. 85, No. 8, (Aug. 1997), pp. 1248–1271.

*Primary Examiner*—David Nelms
*Assistant Examiner*—Hien Nguyen
*Attorney, Agent, or Firm*—Philip H. Albert; Townsend and Townsend and Crew

[57] ABSTRACT

Apparatus is provided to facilitate the process of bulk preprogramming each of the cells in a flash memory or a subblock of a flash memory. In the process, the source and drain of each cell to be preprogrammed is biased such that current need not be flowing between the source and drain through the cell's channel region for charge to be transferred between the cell's channel region and the cell's floating gate. In a specific embodiment, the sources and drains are left floating without any particular bias voltage and the control gates of the cells are set to between 9 and 12 volts above the substrate and held there for about 10 milliseconds (ms). In an alternate embodiment, the sources and drains of all of the cells to be preprogrammed are biased to the same potential, which is a negative voltage, ground, or a positive voltage.

14 Claims, 4 Drawing Sheets

METHOD AND APPARATUS FOR BULK PREPROGRAMMING FLASH MEMORY CELLS WITH MINIMAL SOURCE AND DRAIN CURRENTS

BACKGROUND OF THE INVENTION

The present invention relates to the field of flash memories. More specifically, one embodiment of the invention provides for an improved method of preprogramming flash memory cells.

Flash memories are well known and have found many useful applications where data needs to be semi-permanently stored and retrieved quickly. See, for example, S. Aritome, et al., "Reliability Issues of Flash Memory Cells," *Proceedings of the IEEE*, Vol. 81, No. 5, pp. 776–787 (May 1993), which is incorporated herein by reference for all purposes. Flash memory is rewritable and retains data written thereto even in the absence of power. The ability to retain data in memory in the absence of power and the ability to rewrite that memory is provided by floating gates. A flash memory cell is typically constructed as a single field-effect transistor with a floating gate interposed between the gate of the transistor and the channel region of the transistor. By altering the charge stored on the floating gate, the state of the cell can be changed back and forth between two states, thus allowing one bit of information to be stored. The two states are referred to as an "erased" state and a "programmed" state.

In one type of flash memory, a NOR cell flash memory, all of the cells are initially in an erased state. Zero bits are written to cells by programming the individual cells, while one bits are written to the cells by erasing all of them (or a block of them) at one time.

To program a cell, charge is added to the floating gate. As the floating gate is insulated from the control gate, source and drain of the cell transistor, any charge placed on the floating gate tends to stay there. Although the floating gate is completely insulated, charge can be added and removed using techniques described below and known prior art techniques.

One way to program a cell is shown in FIG. 1. FIG. 1 shows a cell 10 with a control gate 12, a floating gate 14, a source 16 and a drain 18. Control gate 12 and floating gate 14 are separated from source 16 and drain 18, and from a substrate 20 on which they are formed, by an oxide layer 22. Suitable openings in oxide 22 are provided to allow for external connection to source 16 and drain 18. As shown, connections are provided to set Vcg (control gate voltage), Vdd (drain voltage), Vss (source voltage) and Vb (substrate voltage).

To program cell 10, the voltages are set to Vss=0v, Vdd=+6v, Vb=0v and Vcg=+12v. With a 6 volt drain-source drop, current will flow from the drain to source (with negatively charged electrons flowing in the other direction) through a channel region 26 of cell 10. An arrow 24 shows the direction of electron flow. Because of the +12v on the control gate, the electrons flowing from source 16 to drain 18 are drawn to floating gate 14. However, since channel region 26 is insulated from floating gate 14 by oxide 22, electrons cannot flow freely from active region 26 to floating gate 14. Even with the insulation, some electrons can jump from channel region 26 to floating gate 14. Those electrons are referred to as "hot electrons" as they tend to have more energy than the electrons that do not jump. Since the electrons travelling along arrow 24 gain energy as they pass through the electric field between source 16 and drain 18, the electrons nearer to drain 18 have a higher average energy and therefore the hot electrons which jump to floating gate 14 tend to be clustered about the drain junction.

To erase cell 10, the charge on floating gate 14 is removed by well known methods, such as setting Vss such that electrons jump from floating gate 14 to source 16. Overerasing cells is a known problem. With overerasing, too much charge is removed from floating gate 14, to the point where the cell is always biased on regardless of Vcg. Overerasing can occur when an already erased cell is subjected to an erasing process. If an individual cell is to be erased, one can test the individual cell and erase the cell only when the test has determined that the cell is not already erased. Of course, this is not suitable for bulk erasing.

One proposed solution to this problem is to preprogram all of the cells before subjecting the memory to a bulk erase process. See, for example, B. Dipert, et al., "Designing with FLASH MEMORY", pp. 29–30 (Annabooks, 1993). While preprogramming may overprogram some already programmed cells, overprogramming is much less of a problem than overerasing.

As it turns out, preprogramming as shown in FIG. 1 has its disadvantages. For one, preprogramming consumes considerable time and power. A typical preprogramming step for a single takes from 1 to 40 microseconds (usec) and uses from 150 to 500 microamps (uA) during that time. While this is not much for one cell (bit), it is significant when multiplied by all the cells (bits) in the memory. For example, with an 8 megabit (Mbit) memory where 8 bits might be preprogrammed at one time, the programming time is 8 Mbit * 1 usec/8=1 second, but can be as much as 40 seconds. If 8 bits are programmed at one time, the current needed is 1.2 to 4.0 milliamps over the preprogramming period, using as much as 160 milliwatts. In many applications, this is process takes too long and consumes too much power.

In order to shorten the total preprogramming time somewhat, a verify circuit is used to verify that preprogramming is successful so that the preprogramming circuit can move to the next cell as soon as a cell is preprogrammed and verified. This circuit verify uses power and also occupies chip area, which limits the chip area useable for other circuits.

Another disadvantage of the above-described preprogramming process is that the hot electron tunnelling which occurs to program floating gate 14 tends to concentrate near drain 18 and therefore resultant defects in oxide 22 tend to concentrate near the drain-channel junction, leading to premature failure of the cell.

Another form of damage is hot carrier induced leakage. This leakage happens when some of the hot carriers are trapped in the oxide between the floating gate and the active region. If enough charge is trapped after repeated program-erase cycles, the insulation will break down preventing the floating gate from holding a charge.

Therefore, an alternative to this preprogramming process is needed.

SUMMARY OF THE INVENTION

An improved preprogramming process is provided by virtue of the present invention. In one embodiment of the invention, apparatus is provided to facilitate the process of bulk preprogramming each of the cells in a flash memory or a subblock of a flash memory. In the novel process, the source and drain of each cell to be preprogrammed is biased such that current need not be flowing between the source and drain through the channel region for charge to be transferred between the channel region and the cell's floating gate.

In a specific embodiment, the sources and drains of all of the cells to be preprogrammed are biased to 0 volts relative to the channel and the control gates of the cells are set to between 9 and 15 volts above the substrate and held there for about 10 milliseconds (ms).

In an alternate embodiment, the sources and drains are left floating without any particular bias voltage.

One advantage to the present invention is that all of the cells in an 8 Mbit memory can be preprogrammed in 10 to 50 ms using under 100 ua (spread over all the bits), for a total power requirement of less than 500 microwatts (uw).

Another advantage is that the oxide damage due to hot carrier induced leakage is reduced. Hot carrier leakage results from charge being trapped in the oxide layer between the floating gate and the channel region.

Yet another advantage is that bulk programming eliminates the need for a preprogramming verify circuit. Since many cells are preprogrammed at once, they can be preprogrammed for much longer and still take less time overall than the overall time to preprogram the cells individually.

The preferred embodiment uses a triple-well cell, but the present invention can also be used with other types of cells. With a triple-well cell, the control gate voltage (Vcg) is set to about +8v, the P-well voltage (Vp-well) is set to about −6v, and the source and drain are either left floating or are coupled to be at the same potential. The common source/drain potential can be ground, positive or negative. In such a configuration, no current is driven between the source and drain and the current for all the cells in the memory might be 100 ua or less. This current flows between the Vcg and the Vp-well supplies. As with the nontriple-well flash memory, the preprogramming can be done, for the whole memory, in 50 ms or less.

A further understanding of the nature and advantages of the inventions herein may be realized by reference to the remaining portions of the specification and the attached drawings.

DESCRIPTION OF THE PREFERRED EMBODIMENTS

The figures and the accompanying description below are examples of the preferred embodiment of the present invention and a few variations. A person of ordinary skill in the art will understand that many of the specific details of the embodiments shown here can be varied without departing from the novelty of the invention.

Figure 1:
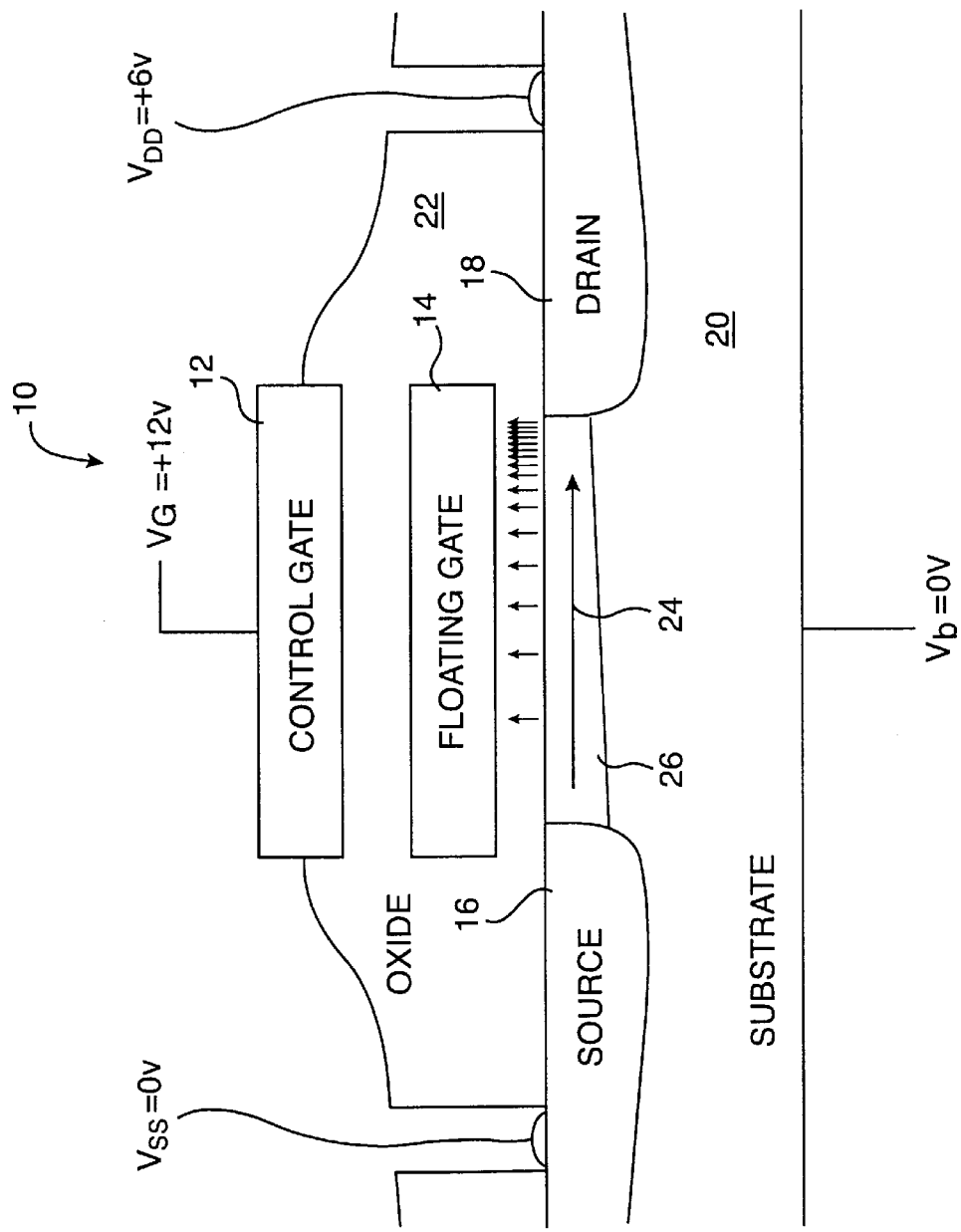
FIG. 1 is a cross-sectional view of a known flash memory cell illustrating a programming process.
Figure 2:
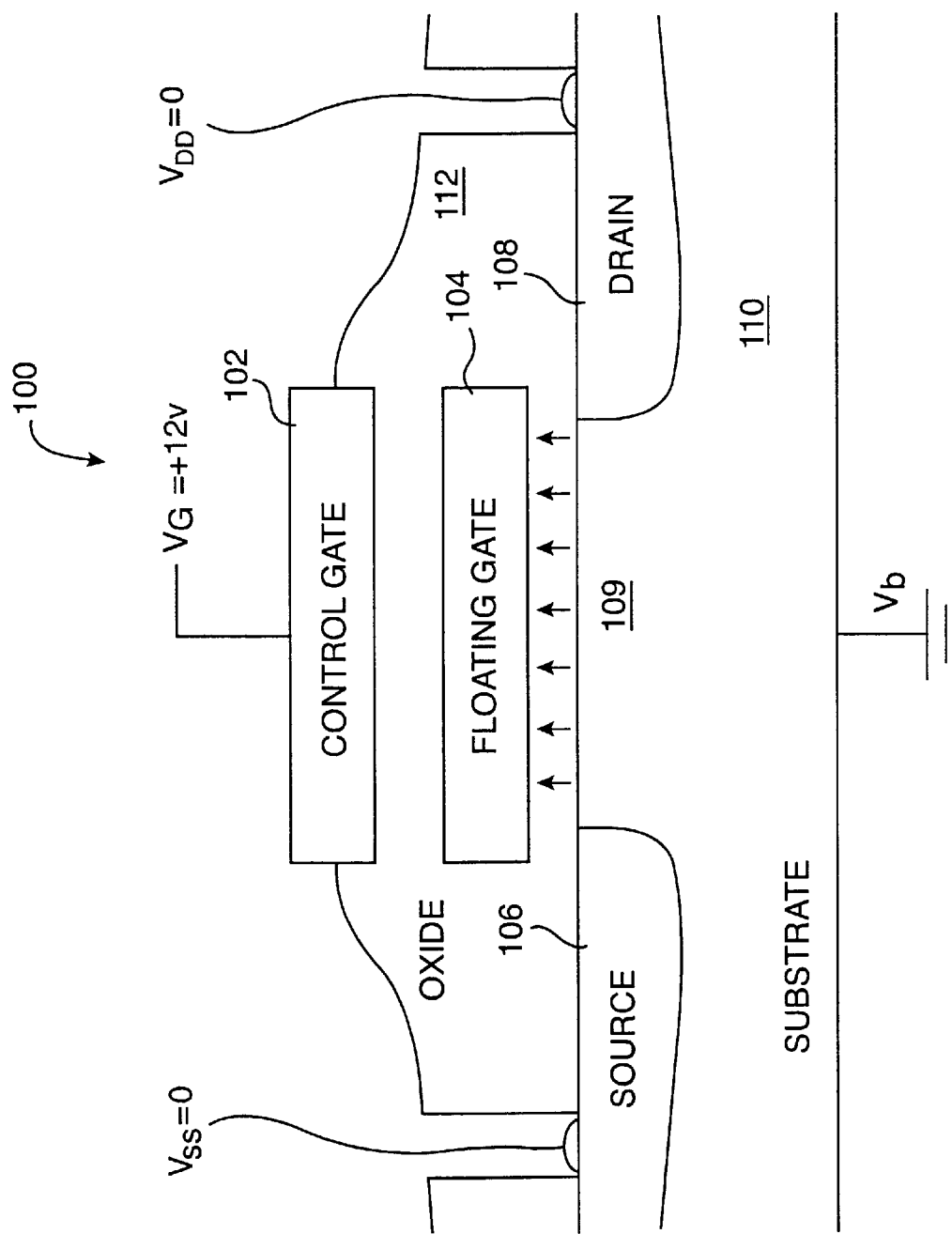
FIG. 2 is a cross-sectional view of a flash memory cell similar to the cell of FIG. 1, configured according to one embodiment of the present invention illustrating a programming process according to the present invention.

Referring now to FIG. 2, a cell 100 of a flash memory is there shown. Cell 100 is shown comprising a control gate 102, a floating gate 104 and a substrate 110 which has a source region 106, a drain region 108 and a channel region 109. When source region 106 and drain region 108 are suitably biased and a field is created using control gate 102 and/or floating gate 104, current flows in channel region 109. Control gate 102 and floating gate 104 are separated from each other and from substrate 110 by an oxide layer 112. As should be apparent, depending on the semiconductor layering processes used, the function of oxide layer 112 could be effected with a single oxide layer or multiple oxide layers.

In a bulk preprogramming step, the various voltages are as shown in FIG. 2: Vss and Vdd are set to a common potential, such as 0V or are left floating, Vb=0 and Vcg=+12v. Since source region 106 and drain region 108 are floating or are at the same potential, no net current flows between them and, therefore, the electrons which tunnel to floating gate 104 are evenly distributed over channel region 109. The oxide thickness between channel region 109 and floating gate 104 is such that floating gate 104 is charged to a programmed state in 10 to 50 msec. Because there is no net current flowing between the source and drain, all of the flash memory cells in a flash memory can be preprogrammed at once (bulk preprogramming). Of course, if desired, the flash memory can be divided into independent blocks, in which case bulk preprogramming might occur on a block by block basis.

Figure 3:
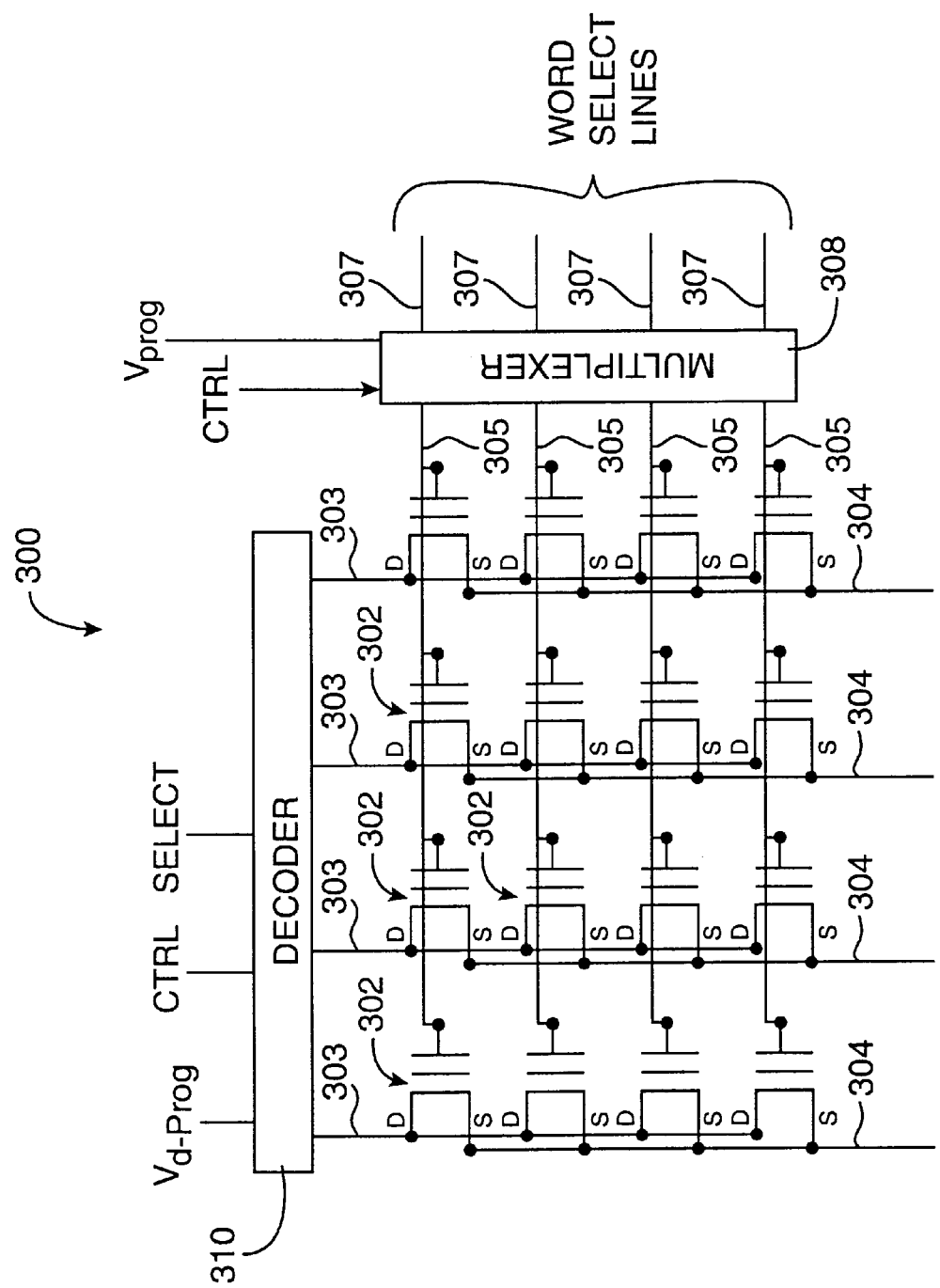
FIG. 3 is schematic diagram showing a plurality of flash memory cells and control circuitry to bulk preprogram the plurality of flash memory cells.

FIG. 3 is a schematic diagram of a 4×4 bit flash memory 300. A 4×4 bit flash memory is used in this example for purposes of clarity, but it should be understood that a typical memory in which the invention is used will be a much larger memory, such as a 64 megabit memory ($64 \times 1024 \times 1024 = 2^{26}$ bits).

Each cell 302 in memory 300 has its drain connected to a bit select line 303, its source connected to a source line 304 and its control gate connected to a gate line 305. Each cell shares a bit select line 303 and a source line 304 with the other cells in its column and shares a gate line 305 with the other cells in its row. In an operation of reading a cell, the bit select line 303 for that cell is biased high and the gate line 305 for that cell is biased such that a programmed cell will not turn on but an erased cell will turn on. The other gate lines 305 are biased so that all other cells in that column will stay off (in the case of overerasing, some of the other cells may erroneously remain on anyway). The bit select line 303 for the cell being read can be monitored to determine if the cell is on. If the cell is on, the cell is deemed to be storing a one.

In normal reading operations, and during certain other operations, word select lines 307 from word select logic (not shown) are coupled directly to gate lines 305 so that a word select line 307 can bias the gates of all the cells in the row containing the cell, or cells, being read. This is done by a multiplexer 308. Multiplexer 308 is controlled by a control signal (CTRL) at an input to multiplexer 308. CTRL is asserted during bulk preprogramming 3. When CTRL is not asserted, multiplexer 308 simply passes the signals on word select lines 307 to their corresponding gate select lines 305. During these operations, a decoder 310, which is also controlled using the CTRL signal, connects one of the bit select lines 303 to a sensing potential so that the state of the selected cell or cells can be detected.

During preprogramming, the CTRL signal is asserted. When CTRL is asserted, multiplexer 308 biases gate lines 305 to Vprog (which is shown as an input to multiplexer 308, but can be generated internally). As the CTRL signal also controls decoder 310, the assertion of CTRL causes Vd-prog to be applied as a bias to the selected bit line 303.

In the example of FIG. 2, Vprog=+12v and Vd-prog=6v, but other voltages are possible. During programming and preprogramming, the source lines are set to ground (0v).

If memory 300 is configured to allow bulk preprogramming of independent blocks of memory comprising less than all of memory 300, the independent separate blocks might be arranged by rows. For example, each of the rows of memory 300 could be independently bulk preprogrammable. While the preprogramming of only four cells does not seem to fit the definition of "bulk", it should be understood that a typical memory has many more cells than shown in FIG. 3 and a block of independent cells may number in the thousands. In any case, where each row is independently programmable, multiplexer 308 is adapted to bias each gate 305 line separately. One such method of biasing is to have word select lines 307 select which rows to bulk preprogram. However, other methods are equally suitable.

It should be understood that many other control circuits and schemes can be used in place of the control circuits shown in FIG. 3 with equivalent or suitable results to perform the function of biasing the elements of the cells for a bulk preprogramming step.

Figure 4:
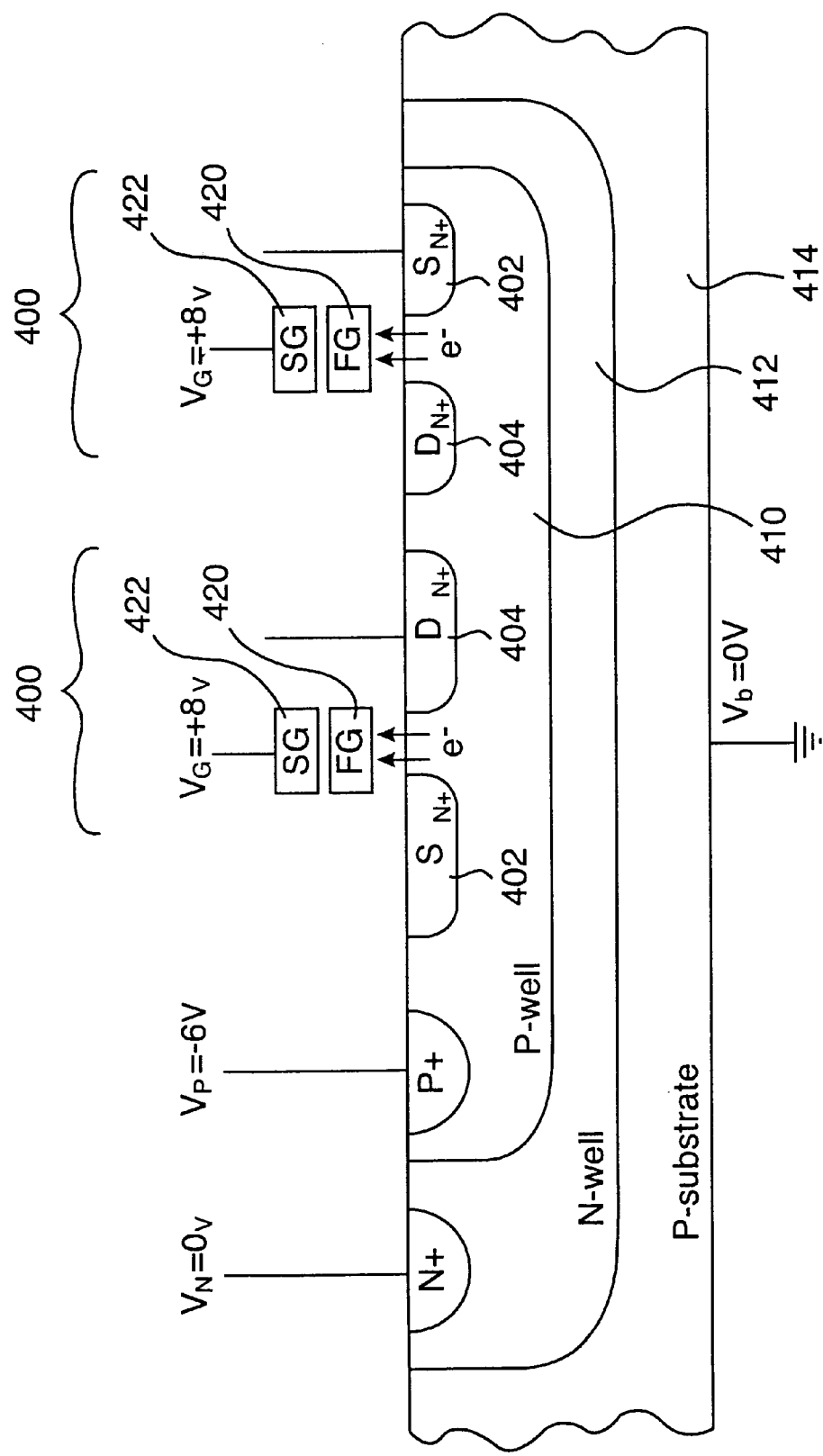
FIG. 4 is a cross-sectional view of a flash memory cell according to the present invention using triple well construction.

The above description explains the invention with reference to the cell shown in FIG. 2. In the preferred embodiment, the flash memory comprises triple-well cells. Two such triple-well cells 400 are shown in FIG. 4. Cells 400 are so named because each of the sources 402 and drains 404 are formed inside a well structure comprising a P-well 410 within an N-well 412 within a P-substrate 414. Only two cells 400 are shown within P-well 410, however in practice many more cells are formed within a P-well. An oxide or other insulating layer (not shown) separates floating gates 420 and control gates 422 from each other and from the triple-well structure.

During bulk preprogramming, N-well 412 and P-substrate 414 are all kept at ground potential (i.e., Vb=Vn=0v), and source 402 and drain 404 are floating while the P-well adjacent to sources 402 and drains 404 is biased negatively and control gates 422 are biased positively (e.g., Vp=−6v, Vcg=+8v). This creates a 14 volt net electric field between the channel regions and the control gates, enough to cause electrons to tunnel onto the floating gate. One advantage of this approach over grounding the P-well and setting Vcg to +12v or +14v is that smaller absolute values for voltages relative to ground can be used (8v as opposed to 12v as used in cell 100 of FIG. 2).

As with cell 100 shown in FIG. 2, it should be apparent that cells 400 could be bulk preprogrammed using different voltages than those shown in FIG. 4 and described herein.

In summary, the preferred embodiments described above allow for a new method of preprogramming flash memory cells. The methods and apparatus in support of those methods allow for bulk preprogramming where the sources and drains of the cells are not driven to different potentials during the preprogramming state, thus allowing many cells to be preprogrammed at once and using much less current per cell.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A method of programming a plurality of memory cells in a flash memory, wherein each of the memory cells in the plurality of memory cells is characterized by a state selected from a programmed state and an erased state, the selected state of a memory cell determined by an amount of charge on a floating gate of that memory cell, the method comprising the steps of:

controlling the sources of the plurality of memory cells such that no significant current is driven through the sources of the plurality of memory cells;

controlling the drains of the plurality of memory cells such that no significant current is driven through the drains of the plurality of memory cells;

biasing a control gate of each of the plurality of memory cells so as to cause electrons to jump from a channel region in sufficient quantity to build up a charge on the floating gates and bring the memory cells to a preprogrammed state.

2. The method of claim 1, wherein the plurality of memory cells comprise all of the memory cells on a flash memory chip.

3. The method of claim 1, wherein the plurality of memory cells comprise one of a plurality of memory blocks wherein the plurality of memory blocks comprise all of the memory cells on a flash memory chip.

4. The method of claim 1, further comprising a step of biasing a substrate of the plurality of memory cells such that no significant current is driven between the sources and drains of the plurality of memory cells.

5. The method of claim 1, wherein each flash memory cell is a triple-well flash memory cell, the method further comprising a step of biasing a substrate of the plurality of memory cells such that no significant current is driven between the sources and drains of the plurality of memory cells.

6. The method of claim 1, wherein the plurality of memory cells is either a NOR or DINOR type flash memory array.

7. The method of claim 1, further comprising a step of bulk erasing following the step of biasing.

8. The method of claim 1, wherein the step of controlling the sources and drains is a step of causing the sources and drains to float.

9. The method of claim 1, wherein the step of controlling the sources and drains is a step of biasing the sources and drains to the same potential.

10. The method of claim 9, wherein the potential is a positive voltage.

11. The method of claim 9, wherein the potential is a negative voltage.

12. A flash memory comprising:

a plurality of cells, wherein each cell of the plurality of cells maintains a states wherein the state is one of an erased state and a programmed state; and a control biasing circuit for biasing the terminals of the plurality of cells to a set of terminal potentials, wherein the terminal potentials are preselected such that programming charge is transferred between a channel region and a floating gate terminal in each of the plurality of cells and the programming charge transferred for each cell exceeds a net amount of current through a source terminal and a net amount of current through a drain terminal for that cell.

13. A flash memory, comprising:

a plurality of cells, wherein each cell of the plurality of cells maintains a state, wherein the state is one of an erased state and a programmed state; and a first biasing means for biasing a floating gate of each of the plurality of cells so as to transfer a programming charge to a floating gate in each of the plurality of cells;

a second biasing means for biasing each of the plurality of cells such that a net current through a source and a net current through a drain is less than a current between the floating gate and a channel region.

14. The flash memory of claim 13, wherein the second biasing means comprises:

bias logic to differentially bias the floating gate relative to the channel region, when the flash memory is in a bulk preprogramming mode, to a bias sufficient to transfer the programming charge between the channel region and the floating gate;

circuit logic for applying a high impedance to the source when the flash memory is in the bulk preprogramming mode; and circuit logic for applying a high impedance to the drain when the flash memory is in the bulk preprogramming mode.

* * * * *